(12) United States Patent
Terashima (10) Patent No.: US 12,191,844 B2
(45) Date of Patent: Jan. 7, 2025

(54) OVERCURRENT DETECTION CIRCUIT, DRIVE CONTROL DEVICE, AND POWER CONVERSION DEVICE

(71) Applicant: FUJI ELECTRIC CO., LTD., Kawasaki (JP)

(72) Inventor: Kenshi Terashima, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 9 days.

(21) Appl. No.: 18/187,670

(22) Filed: Mar. 22, 2023

(65) Prior Publication Data

US 2023/0231549 A1    Jul. 20, 2023

Related U.S. Application Data

(63) Continuation of application No. PCT/JP2022/007208, filed on Feb. 22, 2022.

(30) Foreign Application Priority Data

Apr. 23, 2021 (JP) ................. 2021-073347

(51) Int. Cl.
*H03K 17/0812* (2006.01)
*H02M 1/32* (2007.01)
*H03K 17/687* (2006.01)
*H02M 7/48* (2007.01)

(52) U.S. Cl.
CPC ........ *H03K 17/08122* (2013.01); *H02M 1/32* (2013.01); *H03K 17/687* (2013.01); *H02M 7/48* (2013.01)

(58) Field of Classification Search
CPC .............................................. H03K 17/08122

USPC ......................................................... 327/427
See application file for complete search history.

(56) References Cited

U.S. PATENT DOCUMENTS

2005/0099751 A1*  5/2005  Kumagai ........... H03K 17/0828
                                                                  361/100
2018/0316182 A1    11/2018  Minagawa

FOREIGN PATENT DOCUMENTS

JP      2000014161 A       1/2000
JP      2005151631 A       6/2005
JP      2009229133 A      10/2009
(Continued)

OTHER PUBLICATIONS

International Search Report and (ISA/237) Written Opinion of the International Search Authority for International Patent Application No. PCT/JP2022/007208, mailed by the Japan Patent Office on Apr. 19, 2022.

*Primary Examiner* — Tomi Skibinski (57) ABSTRACT

An overcurrent detection circuit including a detection unit for detecting whether a current flowing between main terminals of a main switching device used by a power conversion device is an overcurrent, and a switching unit for switching among thresholds used for determining the overcurrent in the detection unit according to in which phase of the power conversion device the main switching device is used, in which the detection unit includes a plurality of comparison units for comparing a parameter according to the current flowing between main terminals, and thresholds different from each other, and the switching unit is for switching a comparison unit to use for detection of the overcurrent among the plurality of comparison units.

5 Claims, 3 Drawing Sheets

(56) References Cited

FOREIGN PATENT DOCUMENTS

JP    2018186691 A    11/2018

\* cited by examiner

OVERCURRENT DETECTION CIRCUIT, DRIVE CONTROL DEVICE, AND POWER CONVERSION DEVICE

The contents of the following Japanese patent application(s) are incorporated herein by reference:
NO. 2021-073347 filed in JP on Apr. 23, 2021
PCT/JP2022/007208 filed in WO on Feb. 22, 2022

BACKGROUND

1. Technical Field

The present invention relates to an overcurrent detection circuit, a drive control device, and a power conversion device.

2. Related Art

Conventionally, a power conversion device detects an overcurrent flowing through a main switching device and protects the device (for example, see Patent Documents 1, 2).

Patent Document 1: Japanese Patent Application Publication No. 2000-14161
Patent Document 2: Japanese Patent Application Publication No. 2018-186691

However, a level of the overcurrent that should be detected may be different according to a phase of the main switching device.

DESCRIPTION OF EXEMPLARY EMBODIMENTS

Hereinafter, the present invention will be described through embodiments of the invention, but the following embodiments do not limit the invention according to the claims. In addition, not all of the combinations of features described in the embodiments are essential for a solving means of the invention.

1. Power Conversion Device 1

Figure 1:
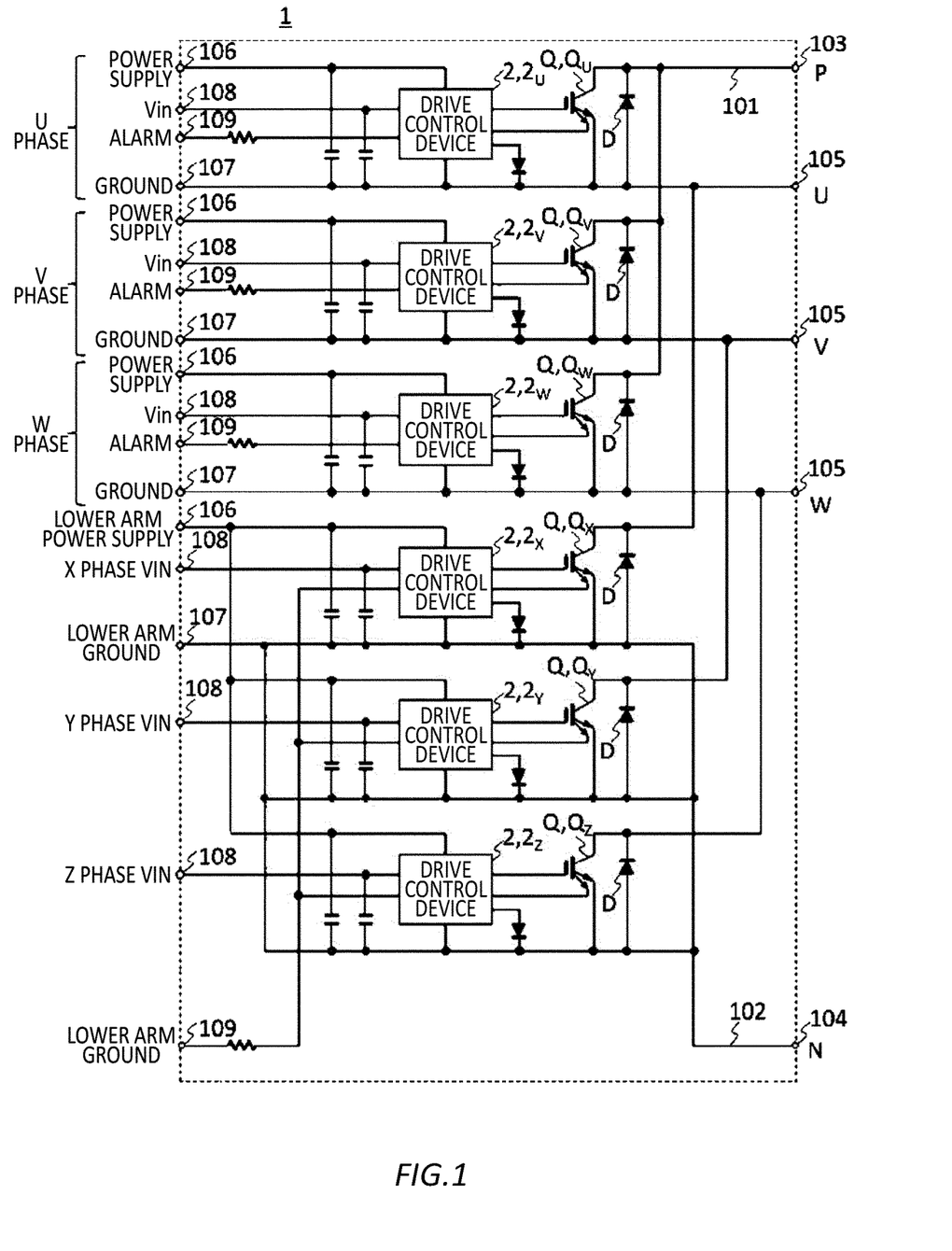
FIG. 1 illustrates a power conversion device 1 according to an embodiment.

FIG. 1 illustrates a power conversion device 1 according to the present embodiment. The power conversion device 1 is a device used for motor drive or power supply, and may be, as an example in the present embodiment, an inverter device for converting a direct current supplied from a positive-side power supply line 101 and a negative-side power supply line 102 into UVW-three phase AC power and outputting the same.

The power conversion device 1 includes a plurality of main switching devices Q and a plurality of drive control devices 2. The power conversion device 1 may further include a positive terminal 103 and a negative terminal 104 that are connected to the positive-side power supply line 101 and the negative-side power supply line 102, a output terminal 105 for outputting AC power, a power supply terminal 106 for supplying power to the drive control device 2, a ground terminal 107 for setting a ground potential of the drive control device 2, a Vin terminal 108 for inputting a drive signal Vin of the main switching device Q, and an alarm terminal 109 for outputting an alarm signal from the drive control device 2. Note that, as an example, a DC voltage of 600 to 800 V may be applied between the positive terminal 103 and the negative terminal 104, and the negative terminal 104 may be connected to a ground potential.

1.1. Main Switching Device Q

The plurality of main switching devices Q may be semiconductor switching devices each having a sense terminal, and in the present embodiment are IGBTs as an example. The plurality of main switching devices Q each form a pair with another main switching device Q, and are connected in series between the positive-side power supply line 101 and the negative-side power supply line 102. In this way, the power conversion device 1 may be provided with multiple pairs of the main switching device Q, Q.

As an example in the present embodiment, the power conversion device 1 is provided with three pairs and a total of six main switching devices Q. Among these, a main switching device $Q_U$ (where the subscript U represents a U-phase) of an upper arm and a main switching device $Q_X$ (where the subscript X represents an X-phase) of a lower arm are connected as a pair in series, and U-phase AC power may be output from the output terminal 105 connected to the series connection point.

A main switching device $Q_V$ (where the subscript V represents a V-phase) of the upper arm and a main switching device $Q_Y$ (where the subscript Y represents a Y-phase) of the lower arm are connected as a pair in series, and V-phase AC power may be output from the output terminal 105 connected to the series connection point.

A main switching device $Q_W$ (where the subscript W represents a W-phase) of the upper arm and a main switching device $Q_Z$ (where the subscript Z represents a Z-phase) of the lower arm are connected as a pair in series, and W-phase AC power may be output from the output terminal 105 connected to the series connection point.

Note that a freewheeling diode D may be connected in anti-parallel to each of the plurality of main switching devices Q.

1.2. Drive Control Device 2

Each drive control device 2 controls the main switching device Q. Each drive control device 2 may be an IC (integrated circuit), and may be integrated into one chip.

Each drive control device 2 is connected to the power supply terminal 106, the ground terminal 107, the Vin terminal 108, and the alarm terminal 109, and drives a gate of the main switching device Q according to the drive signal Vin input from the Vin terminal 108. The drive control device 2 is capable of detecting whether a current flowing between main terminals of the main switching device Q is an overcurrent, and it puts such main switching device Q in OFF state in response to detection of the overcurrent, and outputs the alarm signal from the alarm terminal 109.

Herein, as an example in the present embodiment, each drive control device 2 is a so-called 1ch output drive control device, is provided for each main switching device Q, and controls a single corresponding main switching device Q.

Among these, drive control devices $2_U$, $2_V$, $2_W$ corresponding to the main switching devices Q of the upper arm are connected to individual power supply terminals 106, alarm terminals 109, and ground terminals 107. The ground terminal 107 is connected an emitter terminal of the main switching device Q, and the potential of the emitter terminal is the ground potential.

Drive control devices $2_X$, $2_Y$, $2_Z$ corresponding to the main switching devices Q of the lower arm are connected to a common power supply terminal 106, alarm terminal 109, and ground terminal 107, and the ground terminal 107 is connected to the negative-side power supply line 102. Thus, when the drive control devices $2_X$, $2_Y$, $2_Z$ of each phase are connected asymmetrically to the negative-side power supply line 102, the ground potentials between the drive control devices $2_X$, $2_Y$, $2_Z$ may differ because a current flowing through the main switching devices $Q_X$, $Q_Y$, $Q_Z$ of the lower arm goes around toward the drive control devices $2_X$, $2_Y$, $2_Z$ of the other phases. In this case, accuracy of detection by the drive control devices $2_X$, $2_Y$, $2_Z$ as to whether the current flowing through the main switching device Q is the overcurrent decreases. Therefore, in the power conversion device 1 according to the present embodiment, each drive control device 2 of the lower arm has an overcurrent detection circuit 4, which will be described below, that is set with thresholds that are mutually different, according to in which phase the corresponding main switching device Q is used.

According to the power conversion device 1 described above, since the main switching device Q is put in OFF state in response to detection that the current flowing through the main switching device Q is the overcurrent, a destructive failure of the device by the overcurrent can be prevented.

Since the overcurrent detection circuit 4 in each drive control device 2 is set with the mutually different thresholds, according to in which phase the corresponding main switching device Q is used, even when the magnitude of overcurrent that should be detected is different according to the phase used, the overcurrent can be appropriately detected in each phase.

Figure 2:
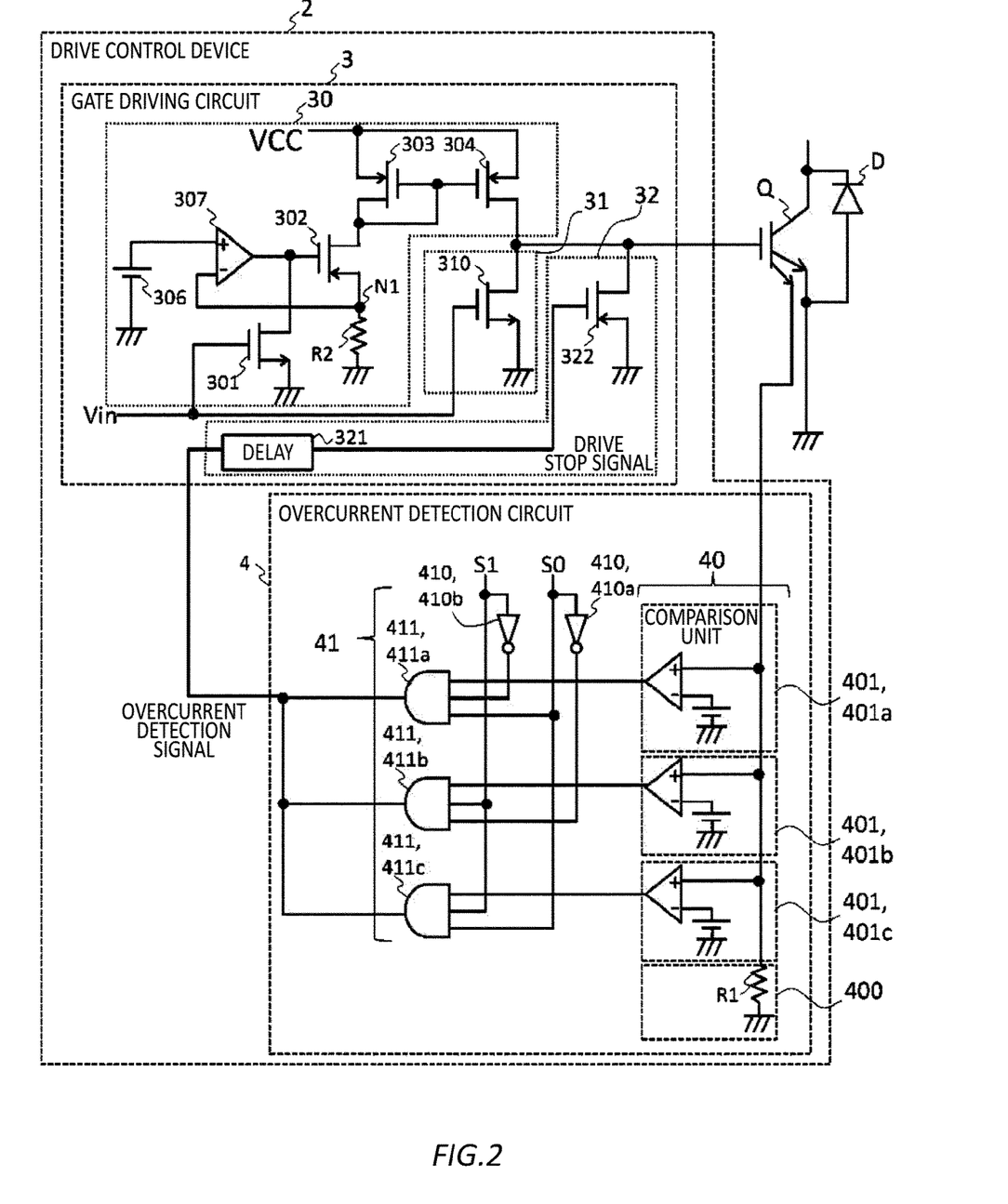
FIG. 2 illustrates a drive control device 2 together with a main switching device Q.

Since the 1ch output drive control device 2 is provided for each main switching device Q of the lower arm and controls a single main switching device Q, unlike when a 3ch output drive control device 2 is provided and controls each of the three main switching devices $Q_X$, $Q_Y$, Oz of the lower arm, it is not required to arrange devices to turn on and turn off each of the three main switching devices Q (as an example, switching devices 301 to 304, 310, 322 or the like represented in FIG. 2 described below) within one IC, and, accordingly, arrangement of the devices and production of the drive control device 2 can be simplified, and the drive control device 2 can be made smaller. Unlike when each of the three main switching devices $Q_X$, $Q_Y$, $Q_Z$ of the lower arm are controlled, the drive circuit of each main switching device Q can be prevented from generating heat and causing the drive control device 2 to become overheated as a whole.

2. Drive Control Device 2

FIG. 2 illustrates the drive control device 2 together with the main switching device Q. The drive control device 2 has the overcurrent detection circuit 4 and a gate driving circuit 3. Note that although the present drawing illustrates the drive control device 2 that controls the main switching device Q of the lower arm, the drive control device 2 that controls the main switching device Q of the upper arm may have the same configuration.

2.1. Overcurrent Detection Circuit 4

The overcurrent detection circuit 4 detects whether the current flowing between the main terminals of the main switching device Q (as an example in the present embodiment, between a collector terminal and the emitter terminal) is the overcurrent. Among the plurality of main switching devices Q included in the power conversion device 1, the overcurrent detection circuit 4 may detect whether the current flowing between the main terminals of the main switching device Q corresponding to the drive control device 2 is the overcurrent. Herein, the overcurrent may be a current that has exceeded the rated current of the power conversion device 1, and the overcurrent may be a current at which a voltage overshoot generated with turning off of the main switching device Q becomes an overvoltage. The overcurrent detection circuit 4 has a detection unit 40 and a switching unit 41.

2.1.1. Detection Unit 40

The detection unit 40 detects whether the current flowing between the main terminals of the main switching device Q corresponding to the drive control device 2 is the overcurrent. The detection unit 40 may have a parameter detection unit 400 and a plurality of comparison units 401 (as an example in the present embodiment, three comparison units 401a to 401c).

The parameter detection unit 400 detects a parameter according to the current flowing between the main terminals of the main switching device Q. As an example in the present embodiment, the parameter detection unit 400 has a sense current detection resistor R1 connected to a sense emitter terminal of the main switching device Q, and may detect, as the parameter, a voltage detected according to a sense emitter current flowing through the sense current detection resistor R1. Note that the parameter detection unit 400 may detect another value as the parameter, such as an emitter current, a sense emitter current or the like measured by a current sensor that is not illustrated. The parameter detection unit 400 may supply a voltage representing a magnitude of the detected parameter to each comparison unit 401.

Each comparison unit 401 compares the parameter supplied from the parameter detection unit 400 with thresholds different from each other. Each comparison unit 401 may be a comparator, and may compare a voltage detected according to the current flowing between the main terminals of the main switching device Q with reference voltages different from each other. As an example in the present embodiment, each comparison unit 401 may compare a voltage input to a non inverting input terminal from the parameter detection unit 400 with a reference voltage input from an inverting input terminal, and may supply, to the switching unit 41, a signal that becomes high when the voltage from the parameter detection unit 400 is greater than the reference voltage.

Herein, the reference voltage of each comparison unit 401 may be set in the production process of the power conversion device 1, and for example, may be set based on a voltage detected by the sense current detection resistor R1 when the main switching device Q is operated in each of the X-phase, Y-phase, and Z-phase, and a minimal overcurrent flows through the main switching device Q.

As an example in the present embodiment, the reference voltage of the comparison unit 401a may be a voltage detected by the sense current detection resistor R1 when the main switching device Q is operated in the X-phase and a minimal overcurrent flows through the main switching device Q. The reference voltage of the comparison unit 401b may be a voltage detected by the sense current detection resistor R1 when the main switching device Q is operated in the Y-phase and a minimal overcurrent flows through the main switching device Q. The reference voltage of the comparison unit 401c may be a voltage detected by the sense current detection resistor R1 when the main switching device Q is operated in the Z-phase and a minimal overcurrent flows through the main switching device Q.

2.1.2. Switching Unit 41

The switching unit 41 switches a threshold used to determine the overcurrent in the detection unit 40 according to in which phase of the power conversion device 1 that the main switching device Q corresponding to the drive control device 2 is used. The switching unit 41 may switch the threshold used to determine the overcurrent by switching the comparison unit 401, among the plurality of comparison units 401 that use different thresholds from each other, for use in detection of the overcurrent. The switching unit 41 may perform switching based on an input switching signal.

As an example in the present embodiment, the switching unit 41 has a plurality of Not circuits 410 (as an example in the present embodiment, two Not circuits 410a, 410b) and a plurality of AND circuits 411 (as an example in the present embodiment, three AND circuits 411a to 411c). The Not circuit 410 is for generating an inverted signal by inverting the switching signal, the Not circuit 410a supplies the inverted signal of a switching signal S0 to the AND circuit 411b, and the Not circuit 410b supplies the inverted signal of a switching signal S1 to the AND circuit 411a. The AND circuit 411 is for taking the logical product of the input signals, and the AND circuit 411a takes the logical product of the switching signal S0, the inverted signal of the switching signal S1, and the signal of the comparison result by the comparison unit 401a. Similarly, the AND circuit 411b takes the logical product of the inverted signal of the switching signal S0, the switching signal S1, and the signal of the comparison result by the comparison unit 401b, and the AND circuit 411c takes the logical product of the switching signal S0, the switching signal S1, and the signal of the comparison results of the comparison unit 401c. According to the switching unit 41 described above, any one of the three AND circuits 411a to 411c are selected according to the two switching signals S0, S1, and the comparison result of the comparison unit 401 corresponding to the selected AND circuit 411 is output.

Herein, the switching signals S0, S1 may be supplied to the overcurrent detection circuit 4 according to in which phase the main switching device Q is used. For example, signal values of the switching signals S0, S1 may be set during production of the drive control device 2, and may be set by electric parts within the drive control device 2. Additionally, the signal values of the switching signals S0, S1 may be supplied from outside of the drive control device 2 after the production of the drive control device 2.

As an example in the present embodiment, when the main switching device Q corresponding to the drive control device 2 is used in the X-phase, the switching signal S0 may be high and the switching signal S1 may be low. In this way, the AND circuit 411a is selected and the comparison results of the comparison unit 401a is output from the switching unit 41. When the main switching device Q corresponding to the drive control device 2 is used in the Y-phase, the switching signal S0 may be low and the switching signal S1 may be high. In this way, the AND circuit 411b is selected and the comparison results of the comparison unit 401b is output from the switching unit 41. When the main switching device Q corresponding to the drive control device 2 is used in the Z-phase, the switching signal S0 may be high and the switching signal S1 may be high. In this way, the AND circuit 411c is selected and the comparison results of the comparison unit 401c is output from the switching unit 41.

The output signal of the switching unit 41 may be an overcurrent detection signal representing whether the current flowing through the main switching device Q is the overcurrent, and it may be high when it is the overcurrent and low when it is not the overcurrent. The switching unit 41 may supply the overcurrent detection signal to the gate driving circuit 3. The switching unit 41 may output the overcurrent detection signal to the alarm terminal 109.

2.2. Gate Driving Circuit 3

The gate driving circuit 3 drives a gate of the main switching device Q. The gate driving circuit 3 may drive a gate of the main switching device Q, among the plurality of main switching devices Q included in the power conversion device 1, corresponding to the drive control device 2.

The gate driving circuit 3 has a turn on circuit 30 for turning on the main switching device Q according to the drive signal Vin in normal operation, a turn off circuit 31 for turning off the main switching device Q according to the drive signal Vin in normal operation, and a circuit breaker 32 for turning off the main switching device Q when the overcurrent has been generated.

2.2.1. Turn on Circuit 30

The turn on circuit 30 has switching devices 301 to 304, a resistor R2, a power supply 306, and an operational amplifier 307. Note that, as an example in the present embodiment, the switching devices 301 to 304 are MOS-FETs, but may be another type of switching device.

In the switching device 301, a main terminal is connected between a gate of the switching device 302 and the ground. The switching device 301 is a P channel type, and a gate of the switching device 301 is connected to the Vin terminal 108. In this way, when the drive signal Vin is low, the switching device 301 is turned on and a gate charge of the switching device 302 is extracted, and when the drive signal Vin is high, the switching device 301 is turned off, and the gate charge of the switching device 302 is not extracted.

The switching device 302 is an N channel type and is connected to the ground via the resistor R2, and when it is in ON-state, a potential of a connection point N1 of the switching device 302 and the resistor R2 is made higher than ground potential by flowing of a current to resistor R2. The operational amplifier 307 has the power supply 306 connected to a non inverting input terminal and the connection point N1 connected to an inverting input terminal, and the more an input voltage of the inverting input terminal approaches an input voltage of the non inverting input terminal, the smaller it makes an output voltage. An output terminal of the operational amplifier 307 is connected with the gate of the switching device 302. The switching device 302, the operational amplifier 307, the power supply 306, and the resistor R2 may form a constant current circuit, and may maintain the magnitude of a current flowing through the connection point N1 when the switching device 301 is OFF (that is, when the drive signal Vin is high).

The switching devices 303, 304 form a current mirror circuit, each have a drain terminal connected to an input voltage VCC, have gates connected to each other, and the connection points of the gates, one of the drain terminals of the switching device 303, and a source terminal of the switching device 302 are connected. The switching device 303, 304 are N channel types, and when a current flows through the switching device 302 and the resistor R2 and the potential of the connection point N1 becomes higher than the ground potential (that is, when the drive signal Vin is low), a current that is equal to the current flowing through the switching device 302 is made a gate current of the main switching device Q. In this way, a voltage is charged to the gate of the main switching device Q, and the main switching device Q is turned on.

2.2.2. Turn Off Circuit 31

The turn off circuit 31 has a switching device 310 whose main terminal is connected between the gate of the main switching device Q and the ground. The switching device 310 is a P channel type and has the Vin terminal 108 connected to a gate. In this way, when the drive signal Vin is low, the switching device 310 is turned on, a gate charge of the main switching device Q is extracted, and the main switching device Q is turned off. Note that, as an example in the present embodiment, the switching device 310 is a MOSFET, but may be another type of switching device.

2.2.3. Circuit Breaker 32

The circuit breaker 32 has a delay circuit 321 and a switching device 322.

By making the turn off operation of the main switching device Q by the circuit breaker 32 slower than the detection operation of the overcurrent by the overcurrent detection circuit 4, the delay circuit 321 prevents conflict of these operations and stabilizes operation. The delay circuit 321 may function as a low pass filter circuit. As an example in the present embodiment, the delay circuit 321 may be an RC series circuit. The delay circuit 321 may supply a drive stop signal for shut down of the main switching device Q to the switching device 322. As an example in the present embodiment, the drive stop signal may be low in normal operation, and may become high according to a high overcurrent detection signal representing that the current flowing through the main switching device Q is the overcurrent being supplied to the delay circuit 321, and a reference time passing.

In the switching device 322, a main terminal is connected between a gate of the main switching device Q and the ground. The switching device 322 is an N channel type, and has the delay circuit 321 connected to a gate. In this way, when the drive stop signal is high, the switching device 322 is turned on, a gate charge of the main switching device Q is extracted, and the main switching device Q is turned off. Note that, the switching device 322 may perform a soft shut down of the main switching device Q, and may turn off the main switching device Q in a slower way compared to the switching device 310 of the turn off circuit 31. Note that, as an example in the present embodiment, the switching device 322 is a MOSFET, but may be another type of switching device.

According to the drive control device 2 described above, since the threshold of overcurrent determination is switched according to in which phase the main switching device Q is used, even when levels of the overcurrent that should be detected is different according to the phase used, the overcurrent can be detected appropriately.

Since the comparison unit 401 used to detect the overcurrent is switched among the plurality of comparison units 401 that use different thresholds from each other, the threshold can be switched without fail.

In each comparison unit 401, since a voltage detected according to the current flowing between the main terminals of the main switching device Q and reference voltage that are different from each other are compared, comparison can be performed by using analog quantities.

Since the threshold can be switched based on a signal supplied according to the phase in which the main switching device Q is used, the threshold can be switched by the supply of the signal. Thus, even after the overcurrent detection circuit is incorporated into the drive control device 2, the threshold can be switched.

3. Modified Embodiment

Figure 3:
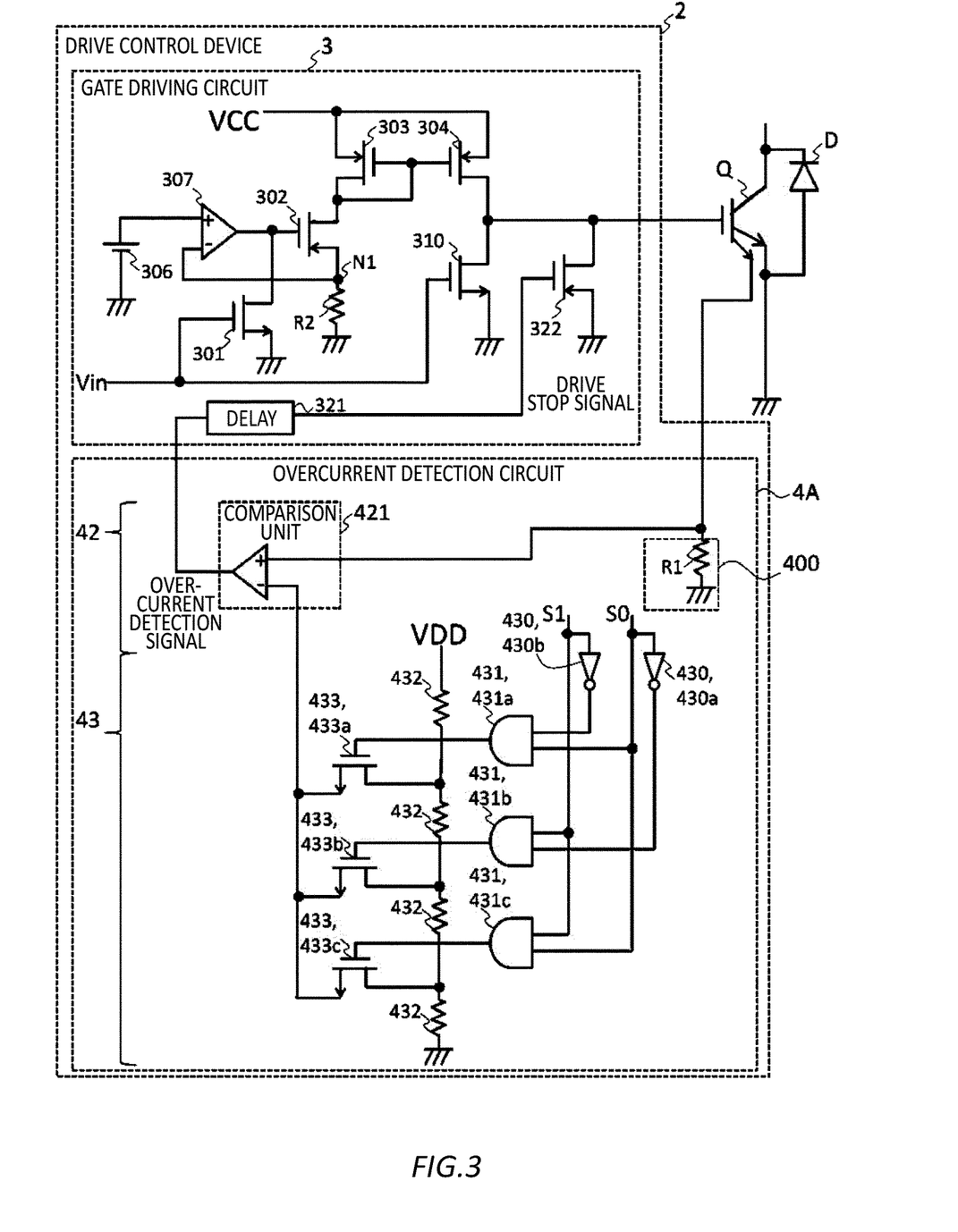
FIG. 3 illustrates an overcurrent detection circuit 4A according to a modified embodiment.

FIG. 3 illustrates an overcurrent detection circuit 4A according to a modified embodiment. Note that, in the modified embodiment, the substantially same configurations as those of the drive control device 2 represented in FIG. 2 are denoted with the same reference signs, and the descriptions thereof are omitted. The overcurrent detection circuit 4A has a detection unit 42 and a switching unit 43.

The detection unit 42 has a comparison unit 421 for comparing a voltage detected according to the current flowing between the main terminals of the main switching device Q, and a reference voltage. Only one of the comparison unit 421 may be installed in the detection unit 42. The comparison unit 421 may compare a voltage input to a non inverting input terminal from the parameter detection unit 400, and a reference voltage input to an inverting input terminal from the switching unit 43, and may supply an overcurrent detection signal that becomes high when the voltage from the parameter detection unit 400 is greater than the reference voltage, to the delay circuit 321.

The switching unit 43 switches a threshold used for overcurrent determination in the detection unit 42 according to in which phase of the power conversion device 1 the main switching device Q corresponding to the drive control device 2 is used. The switching unit 43 may switch the reference voltage supplied to the comparison unit 421.

As an example in the present embodiment, the switching unit 43 has a plurality of Not circuits 430 (as an example in the present embodiment, two Not circuits 430a, 430b), a plurality of AND circuits 431 (as an example in the present embodiment, three AND circuits 431a to 431c), a plurality of resistors 432 (as an example in the present embodiment, four resistors 432a to 432d), and a plurality of switching devices 433 (as an example in the present embodiment, three switching devices 433a to 433c).

The Not circuit 430 is for generating an inverted signal by inverting a switching signal, the Not circuit 430a supplies the inverted signal of the switching signal S0 to the AND circuit 431b, and the Not circuit 430b supplies the inverted signal of the switching signal S1 to the AND circuit 431a.

The AND circuit 431 is for taking the logical product of input signals, and the AND circuit 431a takes the logical product of the switching signal S0 and the inverted signal of the switching signal S1, and supplies the operation result to a gate of the switching device 433a. Similarly, the AND circuit 431b takes the logical product of the inverted signal of the switching signal S0 and the switching signal S1, and supplies the operation result to a gate of the switching device 433b. The AND circuit 431c takes the logical product of the switching signal S0 and the switching signal S1, and supplies the operation result to a gate of the switching device 433c. In this way, any one of the three AND circuits 431a to 431c is selected according to the two switching signals S1, S0, a high output signal is output, and any one of the three switching devices 433a to 433c is put in ON-state.

The four resistors 432a to 432d are for generating voltages that are mutually different by dividing an input voltage VDD, and are connected in series between the ground. The magnitude of the resistors 432a to 432d may be the same, and may be different. Herein, a voltage generated at each connection point between the resistors 432a to 432d may be alternatively selected and supplied as a reference voltage to the inverting input terminal of the comparison unit 421 by the switching devices 433a to 433c. The voltage generated at each connection point may be set based on a voltage detected at the sense current detection resistor R1 when the main switching device Q is operated as the X-phase, Y-phase, Z-phase and a minimal overcurrent flows through the main switching device Q.

The switching device 433a is connected between the connection point between the resistors 432a, 432b and the inverting input terminal of the comparison unit 421, the switching device 433b is connected between the connection point between the resistors 432b, 432c and the inverting input terminal of the comparison unit 421, and the switching device 433c is connected between the connection point between the resistors 432c, 432d and the inverting input terminal of the comparison unit 421. In this way, the reference voltage supplied to the comparison unit 421 can be switched by switching the switching device 433a to 433c that is put in ON-state by the two switching signals S1, S0.

According to the overcurrent detection circuit 4A described above, since the reference voltage supplied to the comparison unit 401 can be switched, the threshold for overcurrent determination can be switched without fail.

Note that in the above-described modified embodiment, although it is described that any of the voltages from the input voltage divided at the resistor 432 is supplied as the reference voltage to the comparison unit 421, any of voltages that are mutually different output from a plurality of voltage sources may be supplied to the comparison unit 421.

4. Other Modified Embodiments

Note that in the above-described embodiment and modified embodiment, the drive control device 2 is described as being provided in each main switching device Q of the upper and lower arms, only when the drive control device 2 is provided in each main switching device Q of the lower arm, a drive control device of another configuration may be provided in the main switching devices Q of the upper arm. In this case, the drive control device of the upper arm may be provided for each main switching device Q of the upper arm and control the main switching devices $Q_U$, $Q_V$, $Q_W$ separately, and may be provided in common in the three main switching devices Q of the upper arm and control each of the main switching devices $Q_U$, $Q_V$, $Q_W$.

While the present invention has been described above by using the embodiments, the technical scope of the present invention is not limited to the scope of the claims according to the above-described embodiments. It is apparent to persons skilled in the art that various alterations or improvements can be added to the above-described embodiments. It is also apparent from the scope of the claims that the embodiments added with such alterations or improvements can be included in the technical scope of the present invention.

Note that the operations, procedures, steps, and stages of each process performed by a device, system, program, and method shown in the scope of the claims, specification, or drawings can be performed in any order as long as the order is not indicated by "prior to," "before," or the like and as long as the output from a previous process is not used in a later process. Even if the operation flow is described by using phrases such as "first" or "next" in the scope of the claims, specification, or drawings, it does not necessarily mean that the process must be performed in this order.

EXPLANATION OF REFERENCES

1: power conversion device;
2: drive control device;
3: gate driving circuit;
4: overcurrent detection circuit;
30: turn on circuit;
31: turn off circuit;
32: circuit breaker;
40: detection unit;
41: switching unit;
42: detection unit;
43: switching unit;
101: positive-side power supply line;
102: negative-side power supply line;
103: positive terminal;
104: negative terminal;
105: output terminal;
106: power supply terminal;
107: ground terminal;
108: Vin terminal;
109: alarm terminal;
301: switching device;
302: switching device;
303: switching device;
304: switching device;
306: power supply;
307: operational amplifier;
310: switching device;
321: delay circuit;
322: switching device;
400: parameter detection unit;
401: comparison unit;
410: Not circuit;
411: AND circuit;
421: comparison unit;
430: Not circuit;
431: AND circuit;
432: resistor;
433: switching device;
D: freewheeling diode;
Q: main switching device;
R1: sense current detection resistor;
R2: resistor.

What is claimed is:

1. An overcurrent detection circuit comprising:
a detection unit configured to detect whether a current flowing between main terminals of a main switching device used by a power conversion device is an overcurrent; and
a switching unit configured to switch among thresholds used for determining the overcurrent in the detection unit according to in which phase of the power conversion device the main switching device is used, wherein
the switching unit is configured to select any of the thresholds set for each phase based on a signal supplied according to the phase in which the main switching device is used,
the detection unit includes a plurality of comparison units configured to compare a parameter according to the current flowing between the main terminals, and thresholds different from each other, and
the switching unit is configured to switch, among the plurality of comparison units, a comparison unit for use in detection of the overcurrent.

2. The overcurrent detection circuit according to claim 1, wherein
each of the plurality of comparison units is configured to compare a voltage detected according to the current flowing between the main terminals, and reference voltages different from each other.

3. The overcurrent detection circuit according to claim 1, wherein
the detection unit includes a comparison unit configured to compare a voltage detected according to the current flowing between the main terminals, and a reference voltage, and
the switching unit is configured to switch the reference voltage supplied to the comparison unit.

4. A drive control device comprising:

a gate driving circuit configured to drive a gate of a main switching device; and the overcurrent detection circuit according to claim 1 configured to detect whether a current flowing between the main terminals of the main switching device is an overcurrent, wherein the gate driving circuit is configured to put the main switching device in OFF state in response to detection of the overcurrent by the overcurrent detection circuit.

5. A power conversion device comprising:

multiple pairs of main switching devices connected in series between a positive-side power supply line and a negative-side power supply line; and the drive control device according to claim 4 provided for each phase of main switching devices, among the multiple pairs of main switching devices, on a side of the negative side power supply line, wherein the overcurrent detection circuit in each drive control device is set with the thresholds that are mutually different, according to in which phase the main switching device in correspondence is used.

* * * * *